(12) United States Patent
Wu et al.

(10) Patent No.: US 8,633,516 B1
(45) Date of Patent: Jan. 21, 2014

(54) SOURCE/DRAIN STACK STRESSOR FOR SEMICONDUCTOR DEVICE

(71) Applicant: Taiwan Semiconductor Manufacturing Company, Ltd., Hsin-Chu (TW)

(72) Inventors: Zhiqiang Wu, Chubei (TW); Gwan Sin Chang, Hsinchu (TW); Kuo-Cheng Ching, Zhubei (TW); Chun Chung Su, New Taipei (TW); Shi Ning Ju, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/631,688

(22) Filed: Sep. 28, 2012

(51) Int. Cl.
*H01L 29/66* (2006.01)

(52) U.S. Cl.
USPC .......................................... 257/192; 257/331

(58) Field of Classification Search
USPC .................................. 257/192, 331
See application file for complete search history.

(56) References Cited

U.S. PATENT DOCUMENTS

| 8,084,309 B2 * | 12/2011 | Cheng et al. ................... 438/163 |
| 8,361,847 B2 * | 1/2013 | Johnson et al. ................ 438/151 |
| 2011/0237046 A1 * | 9/2011 | Maszara et al. ................ 438/424 |

\* cited by examiner

*Primary Examiner* — David Vu
*Assistant Examiner* — Brandon Fox
(74) *Attorney, Agent, or Firm* — Haynes and Boone, LLP

(57) ABSTRACT

The present disclosure provides a semiconductor device. The device includes a substrate, a fin structure formed by a first semiconductor material, a gate region on a portion of the fin, a source region and a drain region separated by the gate region on the substrate and a source/drain stack on the source and drain region. A low portion of the source/drain stack is formed by a second semiconductor material and it contacts a low portion of the fin in the gate region. An upper portion of the source/drain stack is formed by a third semiconductor material and it contacts an upper portion of the fin in the gate region.

20 Claims, 10 Drawing Sheets

SOURCE/DRAIN STACK STRESSOR FOR SEMICONDUCTOR DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects. For example, introducing stress to a gate channel of a FinFET device raises challenges. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
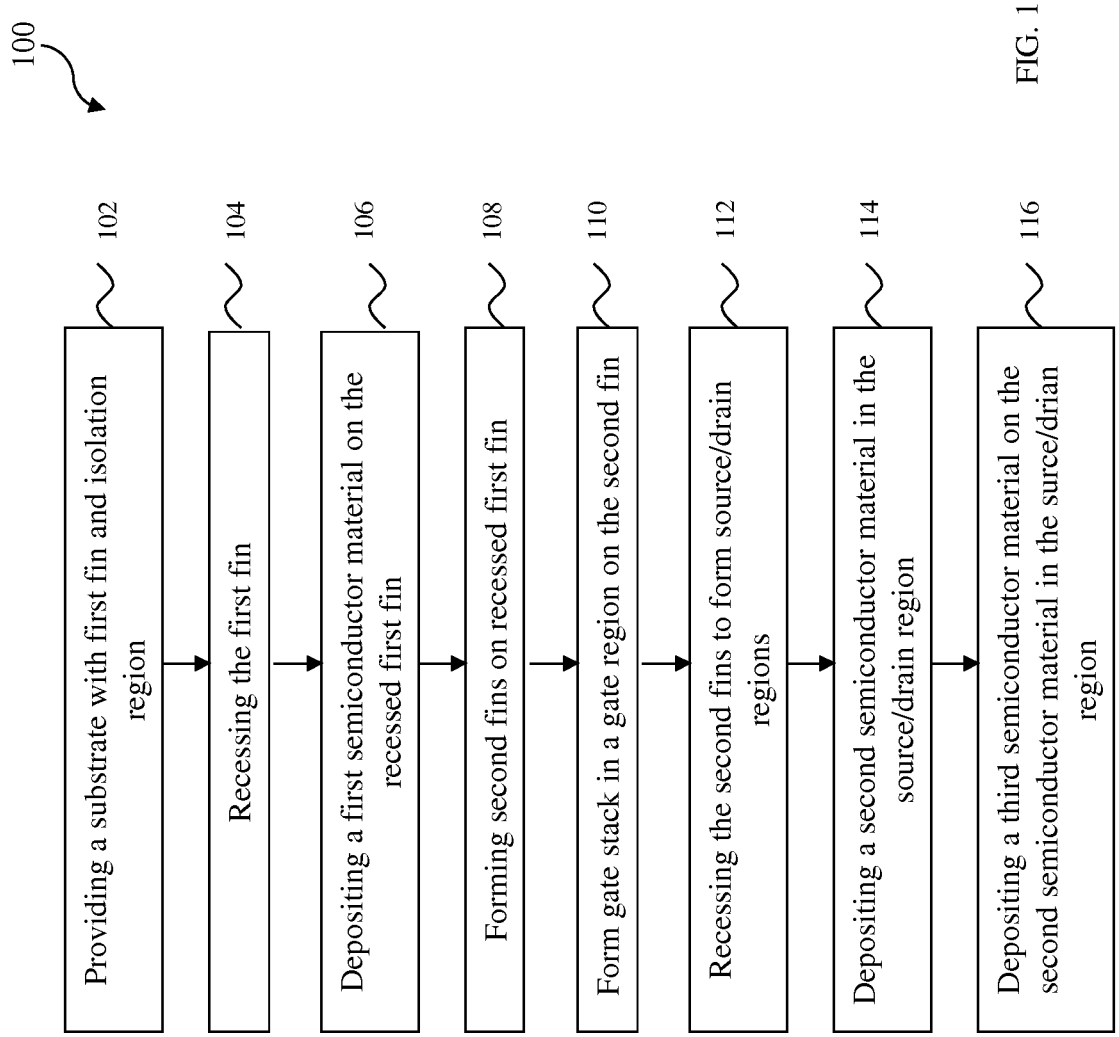
FIG. 1 is a flow chart of an example method for fabricating a FinFET device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a flowchart of a method 100 for fabricating a FinFET device 200 according to aspects of the present disclosure. FIGS. 2-10 are views of the FinFET device 200 at fabrication stages constructed according to the method 100 of FIG. 1. The method 100 and the FinFET device 200 are collectively described with reference to FIGS. 1-10. It is understood that additional steps can be provided before, during, and after the method 100, and some of the steps described can be replaced or eliminated for other embodiments of the method.

Figure 2:
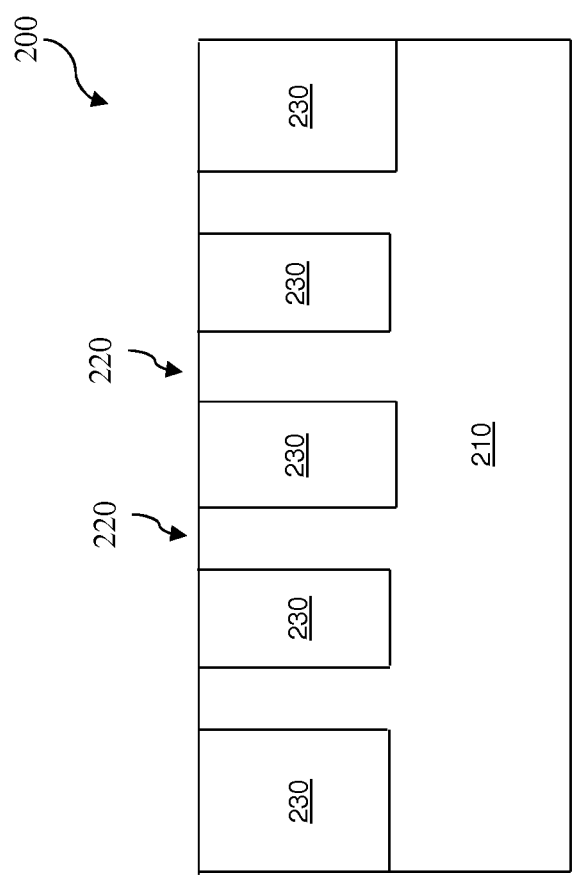
FIGS. 2 to 5 are cross-sectional views of an example FinFET device at fabrication stages constructed according to the method of FIG. 1.

Referring to FIGS. 1 and 2, the method 100 begins at step 102 by providing a substrate 210. The substrate 210 may be a bulk silicon substrate. Alternatively, the substrate 210 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET precursors, the insulator layer is a component (e.g., layer) of a silicon-on-insulator substrate.

The substrate 210 may include various doped regions depending on design requirements as known in the art. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

A first fin 220 is formed on the substrate 210. In some embodiments, the substrate 210 includes more than one first fin 220. The first fin 220 is formed by any suitable process including various deposition, photolithography, and/or etching processes. An exemplary photolithography process includes forming a photoresist layer (resist) overlying the substrate (e.g., on a silicon layer), exposing the resist to a pattern, performing a post-exposure bake process, and developing the resist to form a masking element including the resist. The masking element is then used to etch the fin structure into the substrate 210. The area not protected by the masking element is etched using reactive ion etching (RIE) processes and/or other suitable processes. In an example, the first fin 220 is formed by patterning and etching a portion of the silicon substrate 210. In another example, the first fin 220 is formed by patterning and etching a silicon layer deposited overlying an insulator layer (for example, an upper silicon layer of a silicon-insulator-silicon stack of an SOI substrate). As an alternative to traditional photolithography, the first fin 220 can be formed by a double-patterning lithography (DPL) process. DPL is a method of constructing a pattern on a substrate by dividing the pattern into two interleaved patterns. DPL allows enhanced feature (e.g., fin) density. Various DPL methodologies include double exposure (e.g., using two mask sets), forming spacers adjacent features and removing the features to provide a pattern of spacers, resist freezing, and/or other suitable processes. It is understood that multiple parallel first fins 220 may be formed in a similar manner.

Various isolation regions 230 are formed on the substrate 210 to isolate active regions. For example, the isolation regions 230 separate first fins 220. The isolation region 230 may be formed using traditional isolation technology, such as shallow trench isolation (STI), to define and electrically isolate the various regions. The isolation region 230 includes silicon oxide, silicon nitride, silicon oxynitride, an air gap, other suitable materials, or combinations thereof. The isolation region 230 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. The trenches may be partially filled, as in the present embodiment, where the substrate remaining between trenches forms a fin structure. In some examples, the filled trench may have a multi-layer structure such as a thermal oxide liner layer filled with silicon nitride or silicon oxide. In one embodiment, a chemical mechanical polishing (CMP) process is performed to remove excessive dielectric materials and planarize the top surface of the isolation regions 230 with the top surface of the first fin 220.

Figure 3:
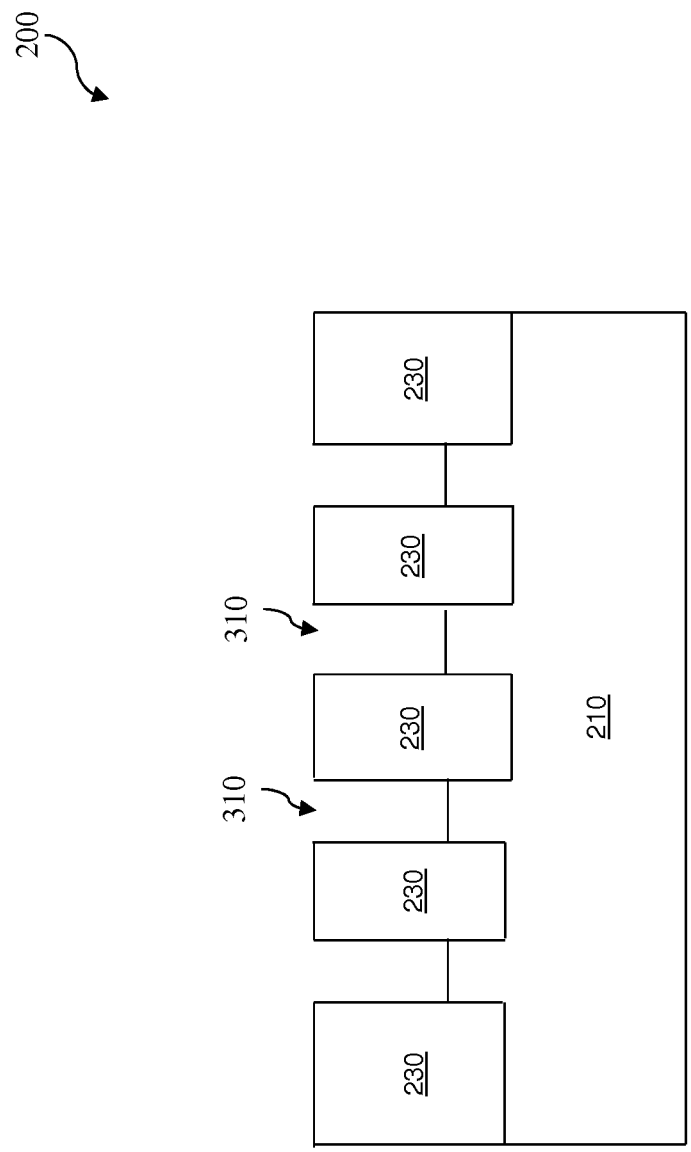

Referring to FIGS. 1 and 3, the method 100 proceeds to step 104 by recessing the first fins 220 to form recessing trenches 310. The recessing process may include dry etching process, wet etching process, and/or combination thereof. The recessing process may also include a selective wet etch or a selective dry etch. A wet etching solution includes a tetramethylammonium hydroxide (TMAH), a HF/HNO3/CH3COOH solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 4:
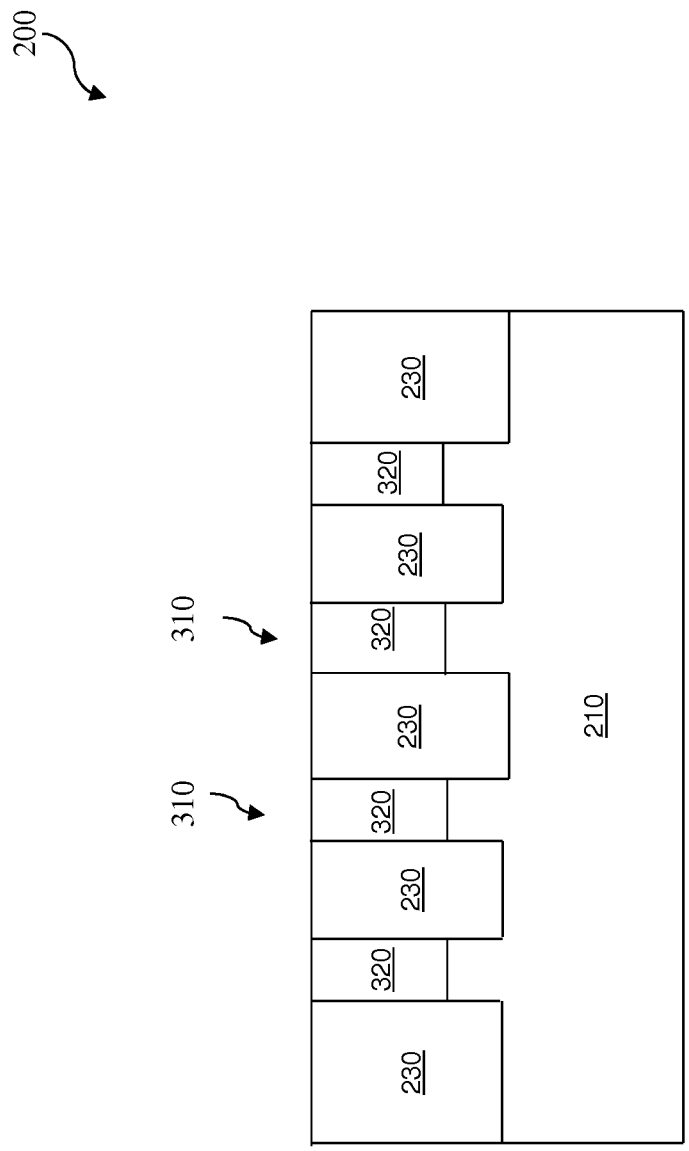

Referring to FIGS. 1 and 4, the method 100 proceeds to step 106 by depositing a first semiconductor material layer 320 on top of the recessed first fin 220 and filling in the recessing trench 310. The first semiconductor material layer 320 may be deposited by an epitaxial growing process. The first semiconductor material layer 320 may be formed of a material of single element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial processes include CVD deposition techniques (e.g., vapor-phase epitaxy (VPE) and/or ultrahigh vacuum CVD (UHV-CVD)), molecular beam epitaxy, and/or other suitable processes.

In one embodiment, the first semiconductor material layer 320 includes an epitaxially growth material of Ge. In another embodiment, the first semiconductor material layer 320 includes an epitaxially growth material of $Si_{1-x}Ge_x$, where x represents Ge composition in atomic percent. The composition ratio of Ge in the SiGe layer 320 can be controlled by epitaxial growing process conditions, such as pressure, gas flow and the first temperature. Additionally, a CMP process may be performed to remove excessive semiconductor material layer 320 and planarize top surfaces of the semiconductor material layer 320 and the isolation region 230.

Figure 5:
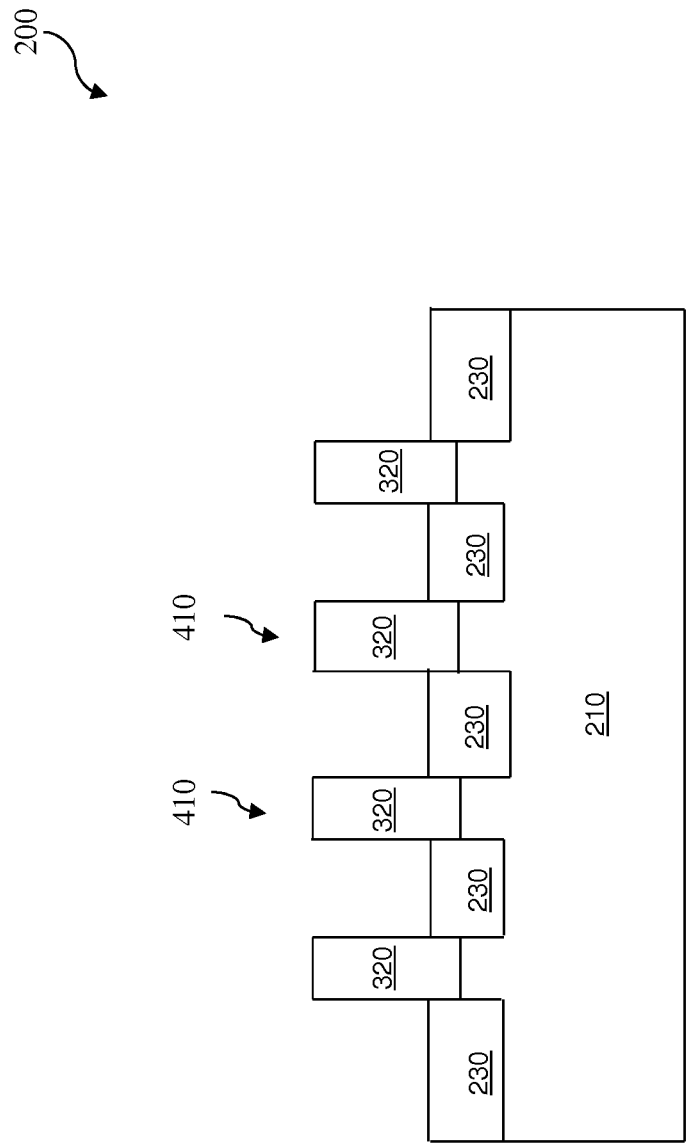

Referring to FIGS. 1 and 5, the method 100 proceeds to step 108 by recessing the isolation regions 230 around the semiconductor material layer 320 to expose an upper portion of the first semiconductor material layer 320, thereby forming second fins 410 on top of the recessed first fin 220. The recessing process may include dry etching process, wet etching process, and/or combination thereof.

Figure 6:
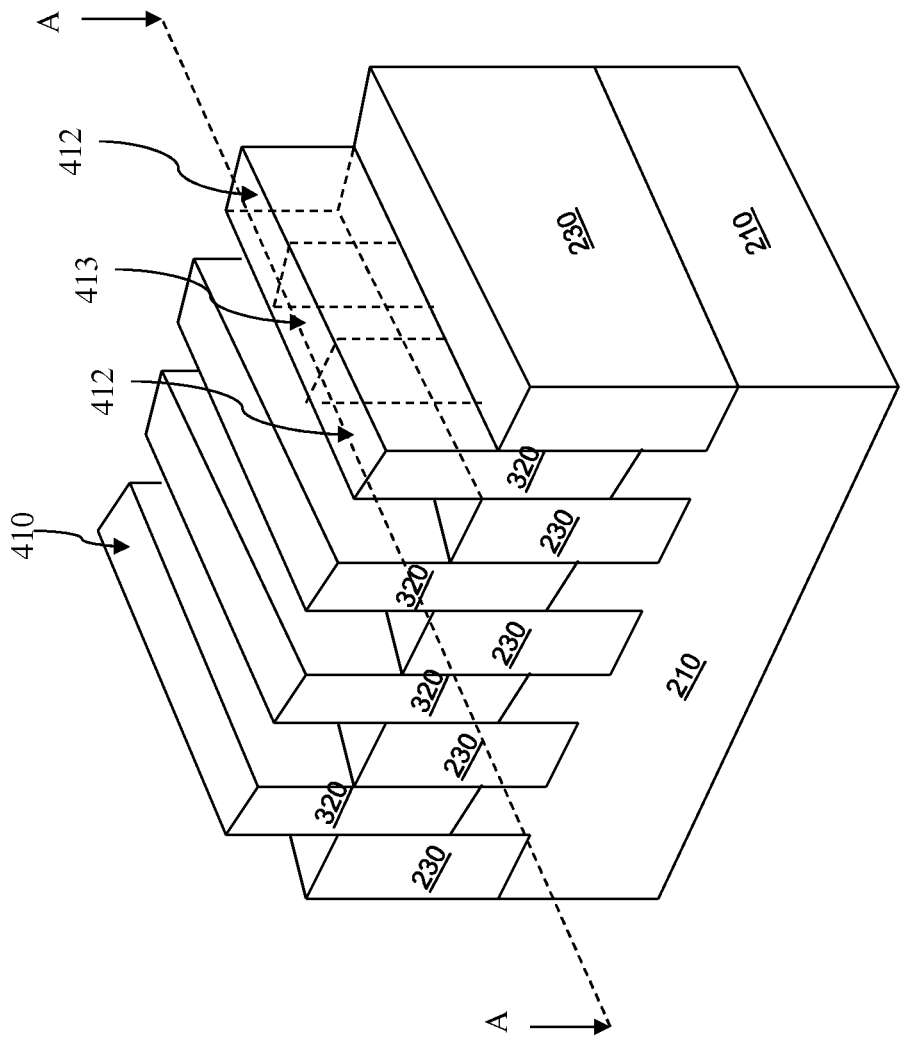
FIG. 6 is a side perspective view of a FinFET device according to various aspects of the present disclosure.

Referring to FIG. 6, in some embodiments, the second fin 410 has source/drain regions 412 and a gate region 413. In some embodiments, a source/drain region 412 is a source region, and another source/drain region 412 is a drain region. A gate region 413 is located between the source/drain regions 412.

Figure 7:
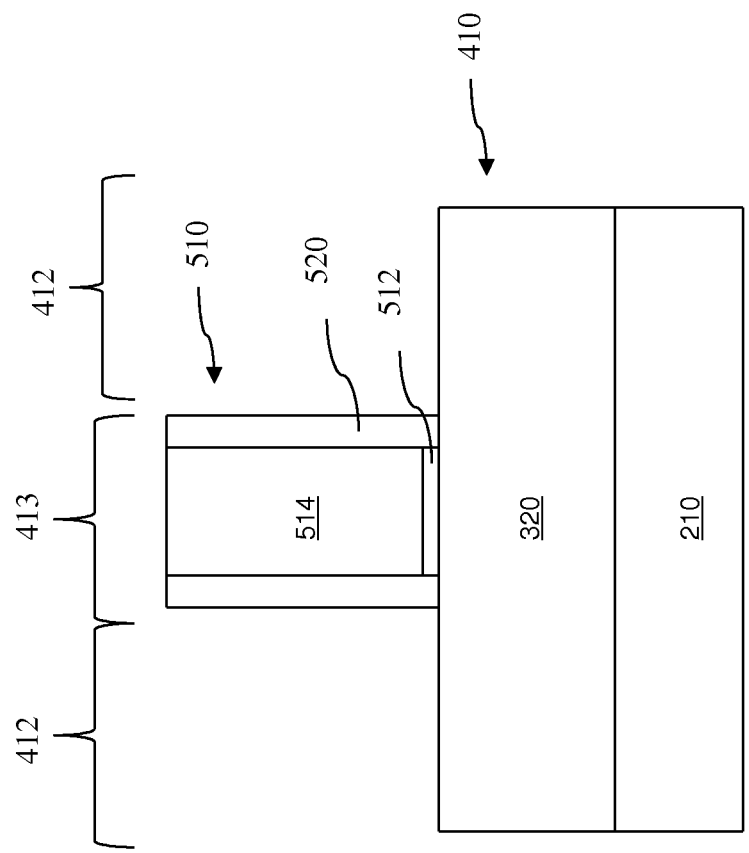
FIGS. 7 to 10 are cross-sectional views of a FinFET device along line A-A in FIG. 6.

Referring to FIGS. 1 and 7, the method 100 proceeds to step 110 by forming a gate stack 510 over the gate region 413 and sidewall spacers 520 along the gate stack 510. In a gate first process, the gate stack 510 may be all or part of a functional gate. Conversely, in a gate last process, the gate stack 510 may be a dummy gate. In the present embodiment, the gate stack 510 is a dummy gate. The dummy gate stacks 510 are to be replaced later by a high-k (HK) and metal gate (MG) after high thermal temperature processes are performed, such as thermal processes during sources/drains formation. The replacing processes may include removing the dummy gate stack to form a gate trench and forming a HK/MG in the gate trench. The dummy gate stack 510 may include the dielectric layer 512, the polysilicon layer 514. The dummy gate stack 510 is formed by any suitable process or processes. For example, the gate stack 510 can be formed by a procedure including depositing, photolithography patterning, and etching processes. The deposition processes include CVD, PVD, ALD, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods (e.g., reactive ion etching). The dielectric layer 512 includes silicon oxide, silicon nitride, or any other suitable materials.

The sidewall spacers 520 may include a dielectric material such as silicon oxide, silicon nitride, silicon carbide, silicon oxynitride, or combinations thereof. The sidewall spacers 520 may include a multiple layers. Typical formation methods for the sidewall spacers 520 include depositing a dielectric material over the gate stack 510 and then anisotropically etching back the dielectric material. The etching back process may include a multiple-step etching to gain etch selectivity, flexibility and desired overetch control.

Figure 8:
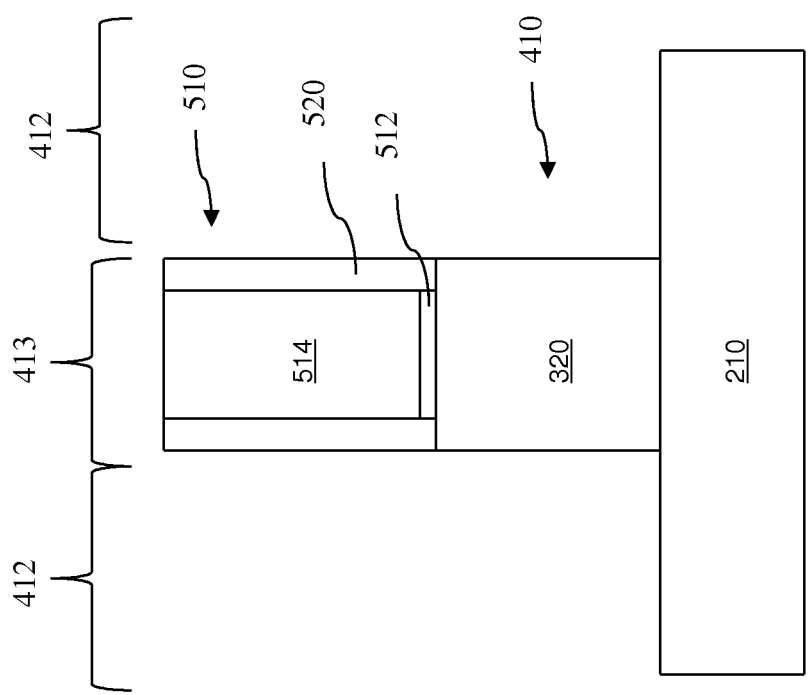

Referring to FIGS. 1 and 8, the method 100 proceeds to step 112 by removing at least a portion of the second fins 410 in the source/drain regions 412. The portion of the second fins 410 is removed by dry etching process, wet etching process, and/or combination thereof.

Figure 9:
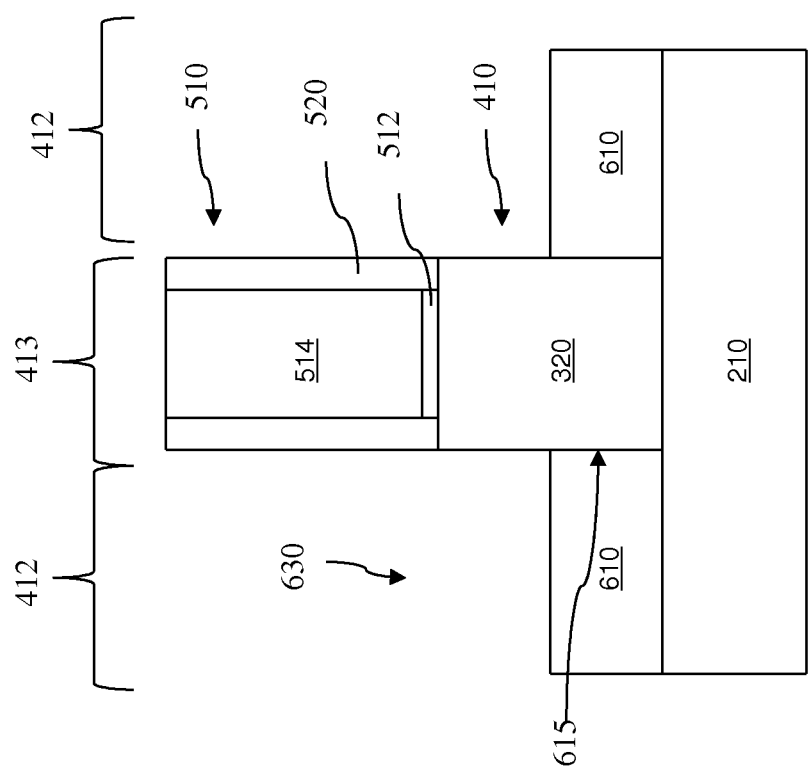

Referring to FIGS. 1 and 9, the method 100 proceeds to step 114 by depositing a second semiconductor material 610 in the source/drain regions 412 to form a lower portion of a source/drain stack 630. A side surface of the second semiconductor material 610 in the source/drain regions 412 contacts a lower portion of the second fin 410 with a first interface 615 in the gate region 413. The second semiconductor material layer 610 may include Ge, Si, SiGe, GaAs, AlGaAs, GaAsP or other suitable semiconductor materials. The second semiconductor material layer 610 may be deposited by epitaxial processes.

Figure 10:
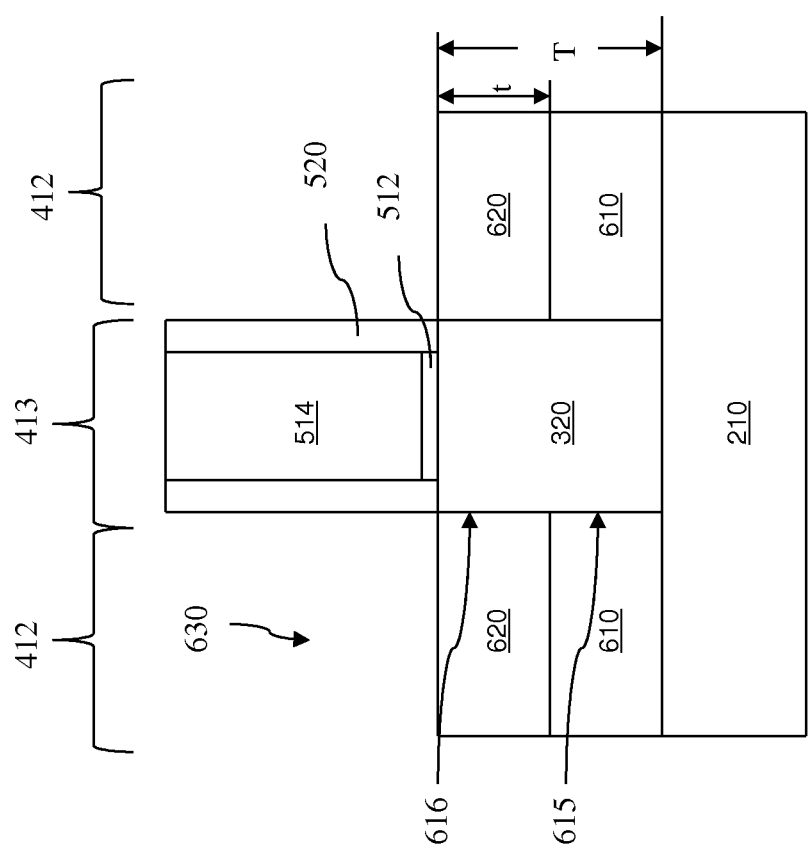

Referring to FIGS. 1 and 10, the method 100 proceeds to step 116 by depositing a third semiconductor material 620 on the second semiconductor material 610 in the source/drain regions 412 to form an upper portion of the source/drain stack 630. The third semiconductor material 620 may include Ge, Si, SiGe, GaAs, AlGaAs, GaAsP or other suitable semiconductor materials. The third semiconductor material 620 is formed similarly in many respects to those discussed above in association with FIG. 9. A side surface of the third semiconductor material 620 in the source/drain regions 412 contacts an upper portion of the second fin 410 with a second interface 616 in the gate region 413.

Referring again to FIG. 10, in the present embodiment, the source/drain stack 630 is configured such that a lattice constant of the third semiconductor 620 (referred to as the third lattice constant) is substantial larger than a lattice constant of the second semiconductor material 610 (referred to as the second lattice constant); the third lattice constant is equal or larger than a lattice constant of the first semiconductor material 320 (referred to as the first lattice constant). For example, the second semiconductor material 610 is $Si_{1-y}Ge_y$, where y represents Ge composition in atomic percent, and the second lattice constant is in a range from 5.526 to 5.549 (by varying y from 0.45 to 0.55); the third semiconductor material 620 is a same material as the first semiconductor material 320, $Si_{1-x}Ge_x$, and the third lattice constant is in a range from 5.645 to 5.658 (by varying x from 0.95 to 1.0). Also, in the present embodiment, the source/drain stack 630 is configured such that a thickness ratio of a thickness (t) of the third semiconductor 620 to a total thickness (T) of the source/drain stack is adjusted to meet criteria of a device performance, such as channel mobility. For example, the thickness ratio is in a range from 0.1 to 0.8. It is believed that a degree of lattice constant mismatch among the first, second and third lattice constants cooperating with the thickness ration of the t and T induces various magnitude of stress to a gate channel in the gate region 413. Thus, the source/drain stack 630 serves as a source/drain stressor.

The FinFET device 200 may undergo further gate replacement processes to replace the dummy gate stack 510 to a high-k (HK)/metal gate (MG). The FinFET device 200 may also undergo further CMOS or MOS technology processing to form various features and regions known in the art. For example, subsequent processing may form various contacts/vias/lines and multilayers interconnect features (e.g., metal layers and interlayer dielectrics) on the substrate 210, configured to connect the various features or structures of the FinFET device 200. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Additional steps can be provided before, during, and after the method 100, and some of the steps described can be replaced or eliminated for other embodiments of the method.

Based on the above, the present disclosure offers a semiconductor device with a source/drain stack stressor to provide an efficient strain to a gate channel. By choosing lattice constant and thickness ratio of each related material of the source/drain stack stressor, different stress magnitude may be induced to the gate channel of the semiconductor device to improve device performance. The source/drain stack stressor also provides a flexibility to use materials which can withstand a higher thermal budget if needed. For example, instead of using germanium tin (GeSn), the source/drain stack stressor is formed by SiGe, which has a substantial higher melting temperature than GeSn.

The present disclosure provides many different embodiments of a semiconductor device with a source/drain stack stressor, which provides one or more improvements over existing approaches. The semiconductor device includes a substrate, a fin structure formed by a first semiconductor material have a first lattice constant on the substrate, a gate region formed on a portion of the fin on the substrate, a source region and a drain region separated by the gate region on the substrate, a source/drain stack having a thickness (T) on the source and drain region, a second semiconductor material, having a second lattice constant, as a low portion of the source/drain stack and contacting a low portion of the fin in the gate region. The second lattice constant is substantial smaller than the first lattice constant. The semiconductor device also includes a third semiconductor material, having a third lattice constant and a thickness (t), on top of the second semiconductor material as an upper portion of the source/drain stack and contacting an upper portion of the fin in the gate region. The third lattice is larger or equal to the first lattice constant.

In another embodiment, a FinFET device includes a substrate having a first fin, a second fin on top of the first fin by epitaxial growth germanium (Ge), a gate region formed on a portion of the second Ge fin, a source region and a drain region separated by the gate region on the substrate, a source/drain stack having a thickness (T) on the source and drain region beside of the second Ge fin in the gate region, an epitaxially growth silicon germanium (SiGe) as a bottom portion of the source/drain stack and contacting a lower portion of the second Ge fin and an epitaxially growth Ge on top of the SiGe as an upper portion of source/drain stack and contacting an upper portion of the second Ge fin in the gate region.

In yet another embodiment, a method for fabricating a FinFET device includes providing a substrate having first fins and isolation regions between the first fins, recessing the first fins, epitaxially growing a first semiconductor material having a first lattice constant to form second fin of on the recessed first fins, forming a dummy gate stack on a portion of the second fins, recessing another portion of the second fin beside the dummy gate stack to form a source/drain region, epitaxially growing a second semiconductor material having a second lattice constant in the source/drain region to form a lower portion of a source/drain stack and contacting a lower portion of the second fin. The second lattice constant is substantial smaller than the first lattice constant. The method also includes epitaxially growing a third semiconductor material having a third lattice constant in the source/drain region to form an upper portion of a source/drain stack and contacting an upper portion of the second fin. The third lattice constant is substantial larger than the second lattice constant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a fin formed by a first semiconductor material have a first lattice constant on the substrate;
   a gate region formed on a portion of the fin on the substrate;
   a source region and a drain region separated by the gate region on the substrate;
   a source/drain stack having a thickness (T) on the source and drain region;
   a second semiconductor material, having a second lattice constant, as a bottom portion of the source/drain stack and contacting a low portion of the fin in the gate region, wherein the second lattice constant is substantial smaller than the first lattice constant; and
   a third semiconductor material, having a third lattice constant and a thickness (t), on top of the second semiconductor material as an upper portion of the source/drain stack and contacting an upper portion of the fin in the gate region, wherein the third lattice is larger or equal to the first lattice constant.

2. The semiconductor device of claim 1, wherein the first semiconductor material of the fin includes an epitaxial growth material.

3. The semiconductor device of claim 1, wherein the second semiconductor material of the bottom portion of the source/drain stack includes an epitaxial growth material.

4. The semiconductor device of claim 1, wherein the third semiconductor material of the upper portion of the source/drain stack includes an epitaxial growth material.

5. The semiconductor device of claim 1, wherein the second lattice constant is in a range from about 5.526 to about 5.549.

6. The semiconductor device of claim 1, wherein the third lattice constant is in a range from about 5.645 to about 5.658.

7. The semiconductor device of claim 1, wherein the thickness ratio of t to T is in a range from about 0.1 to about 0.8.

8. The semiconductor device of claim 1, wherein the fin is a germanium (Ge) fin while the source/drain stack formed by silicon germanium (SiGe) on top of Ge.

9. The semiconductor device of claim 1, wherein the fin is a silicon germanium (SiGe) fin having a first lattice constant while the source/drain stack is another SiGe having a third lattice constant on top of yet another SiGe having a second lattice constant.

10. The semiconductor device of claim 9, wherein the third lattice constant is substantially larger than the second lattice constant.

11. The semiconductor device of claim 9, wherein the third lattice constant is larger or equal to the first lattice constant.

12. A semiconductor device comprising:
    a substrate having a first fin;
    a second fin on top of the first fin, formed by epitaxial growth germanium (Ge);
    a gate region formed on a portion of the second fin;
    a source region and a drain region separated by the gate region on the substrate;
    a source/drain stack having a thickness (T) on the source and drain region beside of the second Ge fin in the gate region;
    an epitaxially grown silicon germanium (SiGe) as a bottom portion of the source/drain stack and contacting a lower portion of the second Ge fin; and
    an epitaxially grown Ge, having a thickness (t), on top of the SiGe as an upper portion of source/drain stack and contacting an upper portion of the second Ge fin in the gate region.

13. The semiconductor device of claim 12, wherein the SiGe has a Ge composition in atomic percent in a range from about 0.45 to about 0.55.

14. The semiconductor device of claim 12, wherein a ratio of t to T is in a range from about 0.1 to about 0.8.

15. A method for fabricating a fin field-effect transistor (FinFET) device, the method comprising:
    providing a substrate having first fins and isolation regions between the first fins;
    recessing the first fins;
    epitaxially growing a first semiconductor material having a first lattice constant to form second fin on the recessed first fins;
    forming a dummy gate stack on a portion of the second fins, wherein the portion of the second fins being defined as a gate region;
    recessing a portion of the second fins beside the dummy gate stack to form a source/drain region;
    epitaxially growing a second semiconductor material having a second lattice constant in the source/drain region to form a lower portion of a source/drain stack and contacting a lower portion of the second fin in the gate region, where in the second lattice constant is substantial smaller than the first lattice constant; and
    epitaxially growing a third semiconductor material having a third lattice constant in the source/drain region to form an upper portion of a source/drain stack and contacting an upper portion of the second fin in the gate region, where in the third lattice constant is substantial larger than the second lattice constant.

16. The method of claim 15, wherein the first lattice constant is in a range from about 5.645 to about 5.658.

17. The method of claim 15, wherein the second lattice constant is in a range from about 5.526 to about 5.549.

18. The method of claim 15, wherein the third lattice constant is larger or equal to the first lattice constant.

19. The method of claim 15, wherein a thickness ratio of the third semiconductor material to the source/drain stack is in a range from about 0.1 to 0.8.

20. The method of claim 15, further comprising:
    removing the dummy gate stack to form a gate trench; and
    forming a high-k/metal gate in the gate trench.

* * * * *